(12) United States Patent
Lehr

(10) Patent No.: US 6,337,263 B1
(45) Date of Patent: Jan. 8, 2002

(54) METHOD FOR IMPROVING THE QUALITY OF METAL CONDUCTOR TRACKS ON SEMICONDUCTOR STRUCTURES

(75) Inventor: Matthias Lehr, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/492,654

(22) Filed: Jan. 27, 2000

(30) Foreign Application Priority Data

Jan. 27, 1999 (DE) .......................................... 199 03 195

(51) Int. Cl.$^7$ .............................................. H01L 21/44
(52) U.S. Cl. ...................... 438/584; 438/597; 438/611; 438/618
(58) Field of Search ................................ 438/584, 597, 438/598, 599, 611, 618

(56) References Cited

U.S. PATENT DOCUMENTS 4,976,996 A    12/1990  Monkowski et al.
5,814,554 A  *  9/1998  De Samber et al.

OTHER PUBLICATIONS

Werner Kern et al.: "Simultaneous deposition and fusion flow planarization of borophosphosilicate glass in new chemical vapor deposition reactor", Thin Solid Films, No. 206, 1991, pp. 64–69.

D. Widmann et al.: "Technologie hochintegrierter Schaltungen" [technology of highly integrated circuits ]in W. Heywang et al. (ed.): "Halbleiterelektronik", [semiconductor electronic], vol. 19, Berlin, Springer Verlag, 1996, pp. 13–40.

International Publication No. WO 96/12295 (Myers et al.), dated Apr. 25, 1996.

International Publication No. WO 97/12399 (Rastogi et al.), dated Apr. 3, 1997.

* cited by examiner

*Primary Examiner*—Kevin M. Picardat
*Assistant Examiner*—D. M. Collins
(74) *Attorney, Agent, or Firm*—Herbert L. Lerner; Laurence A. Greenberg; Werner H. Stemer

(57) ABSTRACT

A method for improving the quality of metal conductor tracks on semiconductor structures of wafers, includes covering each metallizing plane, after being deposited and structured, by an interlevel dielectric. An integrated annealing or tempering is performed at the beginning of the deposition of the interlevel dielectric. The quality of metal conductor tracks on semiconductor structures is improved by preventing the recreation of voids and a considerable shortening of the process time is achieved.

8 Claims, 2 Drawing Sheets

METHOD FOR IMPROVING THE QUALITY OF METAL CONDUCTOR TRACKS ON SEMICONDUCTOR STRUCTURES

BACKGROUND OF THE INVENTION

Field of the Invention

The invention relates to a method for improving the quality of metal conductor tracks on wafers, in which each metallizing plane, after its deposition and structuring, is covered by an interlevel dielectric (ILD).

Modern semiconductor chips as a rule have a plurality of metal conductor track planes that are each separated from one another by interlevel dielectrics (ILDs) or insulation oxides. Those metal conductor tracks, which are typically formed of AlCu, are made by using conventional photolithography and as a rule have very slight feature widths. In other words, the metal conductor tracks are extremely narrow. Differences in the coefficients of thermal expansion of the various materials can lead to the creation of holes or voids in the metal conductor tracks, especially because of the small feature widths. Often, such voids in the metal (so-called stress voids), which have a considerable influence on the function or reliability of the semiconductor chip, are not detectable by evaluating layer resistances or on the basis of yields.

However, the greatly increased stress migration is a considerable threat to reliability and quality.

In order to overcome or at least ameliorate that problem, after the structuring of the metal conductor tracks of all of the metallizing planes, a so-called annealing process step is typically performed. That is understood to mean a tempering process which can optionally be performed in an atmosphere that can contain $H_2$. As a result, surface states can be saturated, thus reducing leakage currents.

In some cases, an annealing process step is also necessary after the structuring of the metal conductor tracks, to prevent the formation of voids in the metal. It is also possible for the annealing process step to be necessary not because of the $H_2$ diffusion, but only because of its positive influence on avoiding the creation of the voids.

However, the disadvantage of such annealing process steps is that they require a very long process time and thus lengthen the total processing time considerably, since loading and unloading the process chambers takes a very long time.

SUMMARY OF THE INVENTION

It is accordingly an object of the invention to provide a method for improving the quality of metal conductor tracks on semiconductor structures, which overcomes the hereinafore-mentioned disadvantages of the heretofore-known methods of this general type, in which the creation of voids is prevented and with which a considerable shortening of the process time can be achieved.

With the foregoing and other objects in view there is provided, in accordance with the invention, a method for improving the quality of metal tracks on wafers, which comprises depositing and structuring metallizing planes; subsequently depositing an interlevel dielectric covering each of the metallizing planes; and performing an integrated annealing and tempering step at an onset of the step of depositing the interlevel dielectric.

A considerable reduction in the total process time can be achieved by the invention by eliminating the separate metal annealing process step. It is especially advantageous if the annealing or tempering step is integrated with the deposition process for the subsequent forming of the interlevel dielectric. To that end, immediately before the deposition of the interlevel dielectric, the metal conductor tracks are thermally treated, and voids are, for instance, avoided. The metal conductor tracks, having properties which are improved, thus also form a better basis for the deposition of the interlevel dielectric.

In accordance with another mode of the invention, in a first partial step of the deposition of the interlevel dielectric, the wafer is heated to the annealing temperature, so that the granular structure of the metal can be converted in the same way as in a pure annealing step.

In accordance with a further mode of the invention, in a second partial step, the deposition of the interlevel dielectric takes place after the annealing step and after the cooling down of the wafer. In a variant of the method, in the second partial step after the annealing step, the wafer can be tempered to the temperature required for the oxide deposition, after which the interlevel dielectric deposition is then carried out. In both cases, a considerable shortening of the total process time is achieved. Furthermore, a variation in the oxide deposition is avoided in this way.

In accordance with an added mode of the invention, the heating of the wafer to the temperature required for the annealing step is indirectly performed by radiant heating. Heating the wafer in a CVD system, which is required anyway for the subsequent deposition of the interlevel dielectric, can preferably be performed by ignition of a non-directional plasma. The non-directional plasma is generated by its ignition without the application of a bias voltage.

In accordance with a concomitant mode of the invention, the integrated annealing step takes place in an atmosphere that contains $H_2$.

Other features which are considered as characteristic for the invention are set forth in the appended claims.

Although the invention is illustrated and described herein as embodied in a method for improving the quality of metal conductor tracks on semiconductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Wafers as a rule include a semiconductor substrate in which electronically active components are integrated. A plurality of metallizing planes are located on the semiconductor substrate (or on the wafer) for connecting the individual components to one another electrically, or for connecting them to peripheral terminals. The metallizing planes are separated from one another by insulation layers. Contact holes are provided in the insulation layers at selected points. Contact between the components and the metallizing planes, or among the individual metallizing planes, is made possible through the holes. The metallizing planes which, for instance, are formed of AlCu, are made by using conventional photolithography, with subsequent metallization.

Figure 2A:
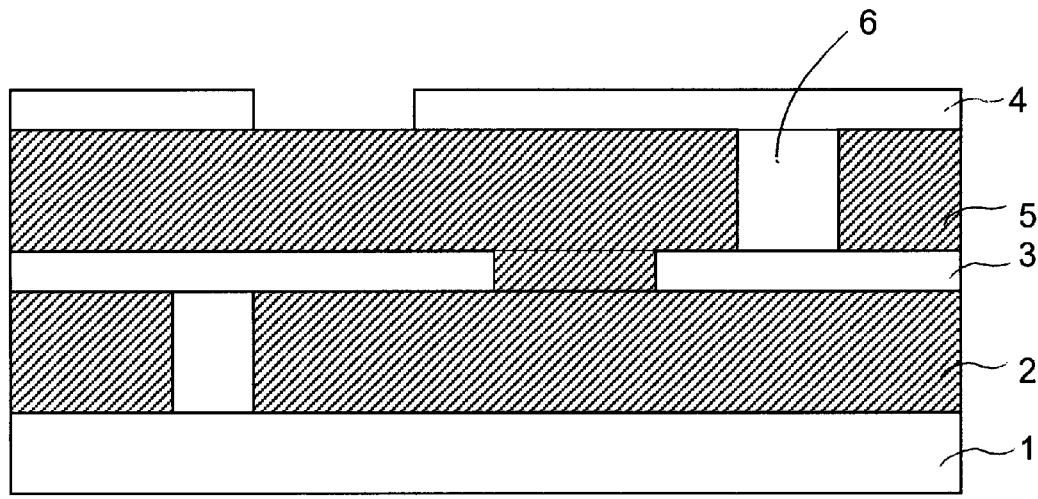
FIGS. 2a and 2b are diagrammatic, cross-sectional views of a semiconductor substrate with a plurality of metallizing planes.
Figure 2B:
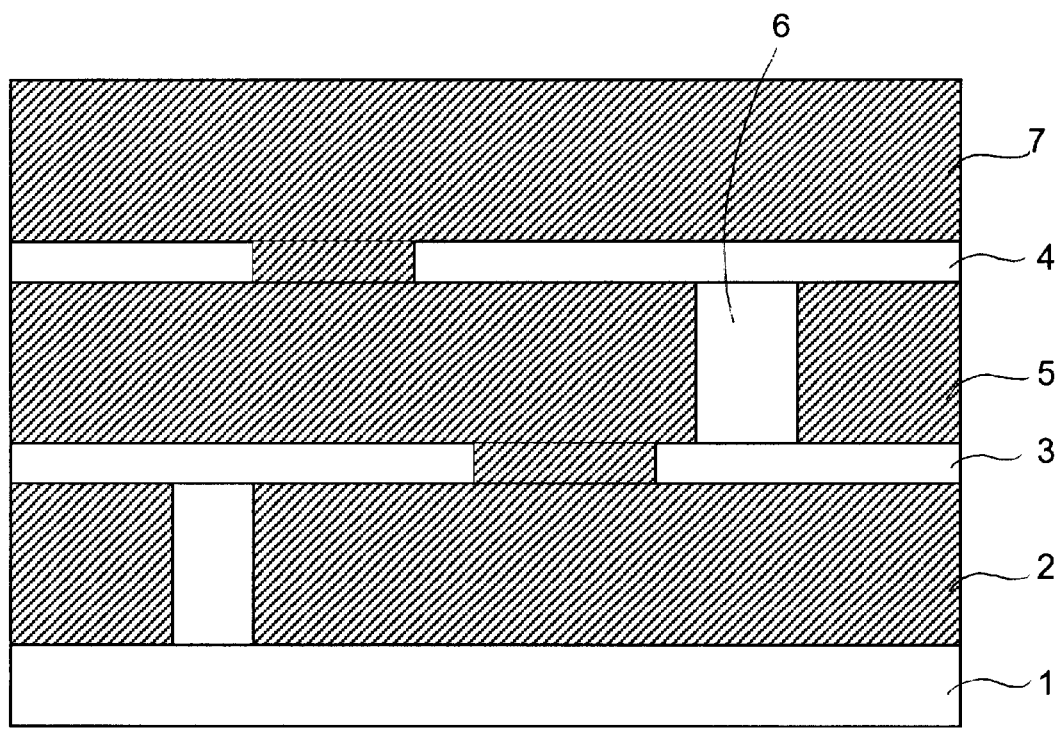

Referring now to the figures of the drawings in detail and first, particularly, to FIGS. 2a and 2b thereof, there is seen an example of one such semiconductor substrate. A structured first insulation layer 2 is applied to a semiconductor substrate 1 in this case. A so-called first metallizing plane 3 is located on this insulation layer 2 and it is also structured. A second metallizing plane 4 is located above the first metallizing plane 3 and is electrically insulated from the first metallizing plane 3 by a further insulation layer 5. Contact holes 6 are provided only at predetermined sites.

In accordance with the method of the invention, an insulation layer 7 is subsequently applied. This is shown in FIG. 2b.

Figure 1:
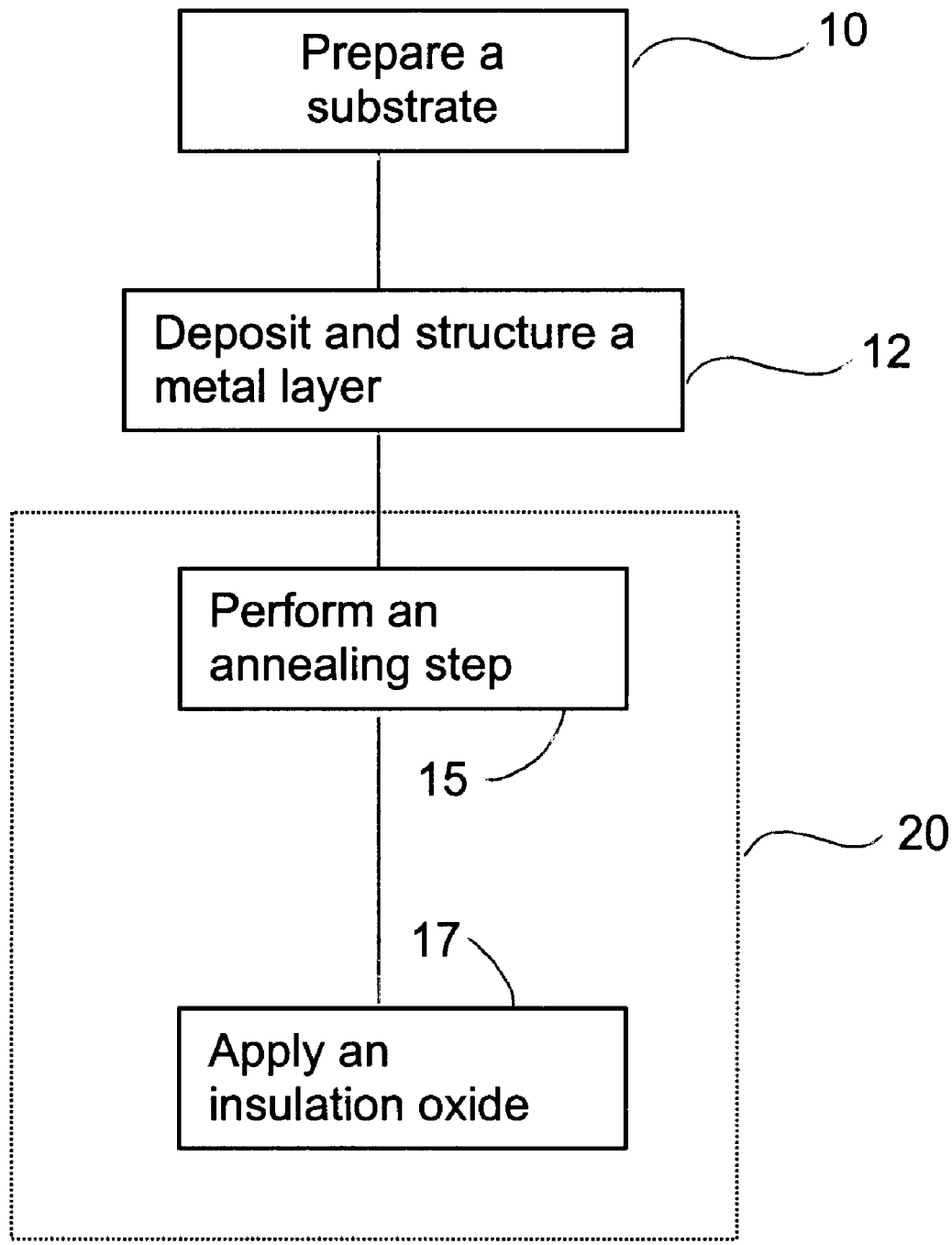
FIG. 1 is a flow chart showing a sequence of the method according to the invention.

FIG. 1 illustrates a sequence of the method of the invention. According to the method, the semiconductor substrate or wafer is prepared or furnished in a step 10 and each metallizing plane is deposited and structured in a step 12. An integrated annealing or tempering step 15 is performed after steps 10 and 12 at an onset of a deposition of the subsequent insulation layer 7 in a step 20. In the present exemplary embodiment, the insulation layer 7 represents the interlevel dielectric. The integrated annealing or tempering step 15 serves to cure the second metallizing plane 4 in the present exemplary embodiment.

The integrated annealing process step 15 is performed in such a way that after the deposition and structuring of the metal conductor tracks (metallizing plane) in the step 12, the semiconductor substrate is preheated in the first partial step 15 of the deposition of the interlevel dielectric in the step 20. The preheating is brought to the annealing temperature for a predetermined time, so that a granular structure of the metal can be converted.

The heating of the semiconductor substrate can be carried out by radiant heating in a CVD system by ignition of a non-directional plasma, or in other words without an application of a bias voltage.

An actual deposition of the subsequent insulation layer 7 is carried out, after the semiconductor substrate cools down, in a subsequent second partial step 17 of the deposition of the insulation layer in the step 20. Alternatively, the semiconductor substrate can also be tempered initially after the annealing step 15 to the temperature required for the oxide deposition, after which the deposition of the insulation layer in the step 17 then takes place. This saves considerable process time.

Further metallizing planes which may possibly be necessary can then also be treated, after each of them has been produced, through the use of an integrated annealing process step before the deposition of the next respective insulation layer. In this process, steps 12, 15 and 17 shown in FIG. 1, in particular, are performed again.

I claim:

1. A method for improving the quality of metal tracks on wafers, which comprises:

depositing and structuring metallizing planes; and subsequently depositing an interlevel dielectric covering each of the metallizing planes in an integrated annealing and tempering step performed at an onset of the interlevel dielectric deposition:

by preheating a wafer to an annealing temperature in an initial part of the interlevel dielectric deposition; and by depositing the interlevel dielectric after the annealing step and after the wafer cools down.

2. The method according to claim 1, which comprises carrying out the annealing and tempering step by preheating a wafer to an annealing temperature in an initial part of the step of depositing the interlevel dielectric.

3. The method according to claim 2, which comprises depositing the interlevel dielectric after the annealing step and after the wafer cools down.

4. The method according to claim 1, which comprises tempering the wafer to a temperature required for oxide deposition after the annealing step, and then depositing the interlevel dielectric.

5. The method according to claim 1, which comprises carrying out the step of heating the wafer by radiant heating.

6. The method according to claim 5, which comprises carrying out the step of heating the wafer in a CVD system by ignition of a non-directional plasma.

7. The method according to claim 6, which comprises carrying out the step of igniting the plasma without bias voltage.

8. The method according to claim 1, which comprises carrying out the integrated annealing step in an atmosphere containing $H_2$.

* * * * *